(12) United States Patent
Kim et al.

(10) Patent No.: US 10,741,616 B2
(45) Date of Patent: Aug. 11, 2020

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: JongSung Kim, Paju-si (KR); JoonYoung Heo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/723,036

(22) Filed: Dec. 20, 2019

(65) Prior Publication Data

US 2020/0127059 A1   Apr. 23, 2020

Related U.S. Application Data

(62) Division of application No. 15/669,489, filed on Aug. 4, 2017, now Pat. No. 10,553,652.

(30) Foreign Application Priority Data

Aug. 31, 2016   (KR) ........................ 10-2016-0112194

(51) Int. Cl.
*H01L 27/32* (2006.01)
*H01L 51/50* (2006.01)
*H01L 51/52* (2006.01)

(52) U.S. Cl.
CPC ........ *H01L 27/3213* (2013.01); *H01L 27/322* (2013.01); *H01L 27/3246* (2013.01);
(Continued)

(58) Field of Classification Search
CPC ............ H01L 27/3213; H01L 27/3223; H01L 27/3246; H01L 27/3258; H01L 51/5284;
(Continued)

(56) References Cited

U.S. PATENT DOCUMENTS

2004/0119398 A1* 6/2004 Koo .................... H01L 51/5271
313/499
2016/0118451 A1* 4/2016 Youn ................... H01L 27/3262
257/40

(Continued)

FOREIGN PATENT DOCUMENTS

EP    3026724 A1    6/2016

*Primary Examiner* — Matthew E Warren
(74) *Attorney, Agent, or Firm* — Birch, Stewart, Kolasch & Birch, LLP

(57) ABSTRACT

A method of manufacturing an organic light emitting display device, includes forming a thin film transistor on a substrate, the substrate having emissive areas; forming a planarization layer on the thin film transistor; forming a contact hole exposing a source or drain electrode of the thin film transistor through the planarization layer; forming a first electrode connected to the source or drain electrode of the thin film transistor through the contact hole; forming a hole between adjacent emissive areas, the hole being provided in the planarization layer; forming a pixel defining layer on a portion of the first electrode and in the hole, wherein the pixel defining layer fills a portion of the hole and is provided on both side wall and floor of the hole; and forming a light emitting layer, a second electrode and an encapsulation layer sequentially on the substrate having the first electrode and the pixel defining layer.

15 Claims, 14 Drawing Sheets

(52) U.S. Cl.
CPC ...... *H01L 27/3258* (2013.01); *H01L 51/5012* (2013.01); *H01L 51/5237* (2013.01); *H01L 51/5284* (2013.01)

(58) Field of Classification Search
CPC .. H01L 51/5012; H01L 51/5237; H01L 51/56
USPC .......................................................... 257/40
See application file for complete search history.

(56) References Cited

U.S. PATENT DOCUMENTS

| | | |
|---|---|---|
| 2016/0149155 A1 | 5/2016 | Kim |
| 2016/0233289 A1 | 8/2016 | Son et al. |
| 2017/0338444 A1* | 11/2017 | Teramoto ............ H01L 27/3211 |
| 2018/0006106 A1* | 1/2018 | Oh ..................... H01L 27/3262 |
| 2019/0019857 A1* | 1/2019 | Matsumoto ......... H01L 27/3262 |

* cited by examiner

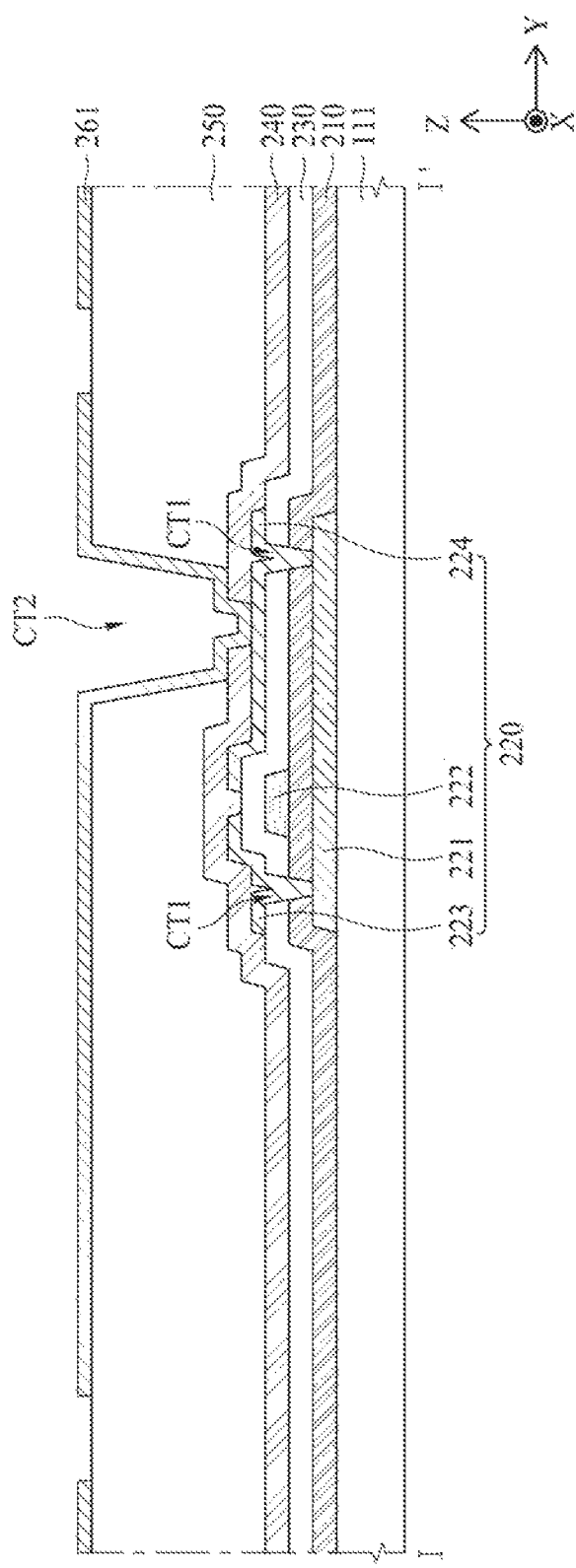

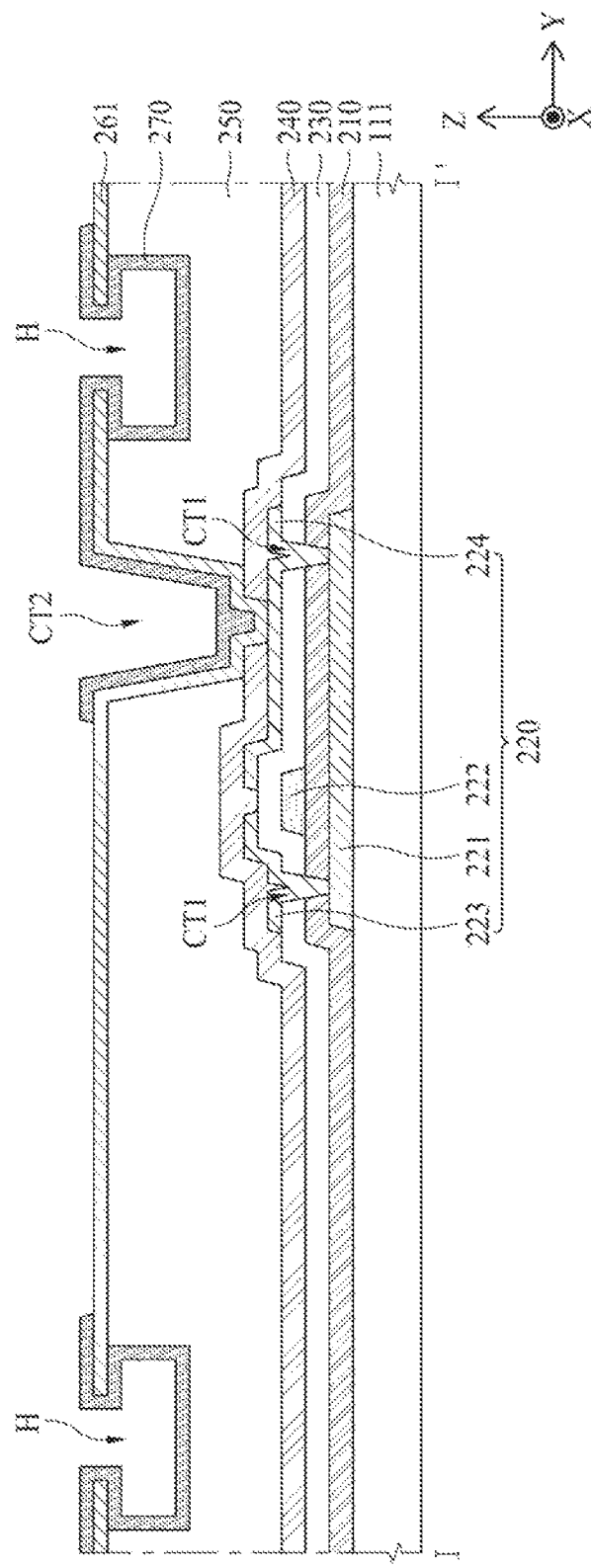

ORGANIC LIGHT EMITTING DISPLAY DEVICE AND METHOD FOR MANUFACTURING THE SAME

CROSS-REFERENCE TO RELATED APPLICATION

This application is a Divisional of copending U.S. patent application Ser. No. 15/669,489, filed on Aug. 4, 2017, which claims priority under 35 U.S.C. § 119(a) to Korean Patent Application No. 10-2016-0112194 filed on Aug. 31, 2016, all of these applications are hereby incorporated by reference as if fully set forth herein.

BACKGROUND OF THE INVENTION

Field of the Invention

The present disclosure relates to an organic light emitting display device and a method of manufacturing the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

As a type of display device, organic light emitting display devices are self-emitting display devices and are better in viewing angle and contrast ratio than LCD devices. Also, since the organic light emitting display devices do not need a separate backlight, it is possible to lighten and make thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include a plurality of pixels each including an organic light emitting device and a bank which divides the pixels for defining the pixels. The bank may act as a pixel defining layer. The organic light emitting device includes an anode electrode, a hole transporting layer, an organic light emitting layer, and an electron transporting layer, and a cathode electrode. In this instance, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

The organic light emitting device includes a red organic light emitting device emitting red light, a green organic light emitting device emitting green light, and a blue organic light emitting device emitting blue light, or include only a white organic light emitting device emitting white light. If the organic light emitting device includes the white organic light emitting device, the organic light emitting layer and the cathode electrode may be provided in the pixels in common. That is, the organic light emitting layer and the cathode electrode may be connected to each other between adjacent pixels.

In order to enhance a color reproduction rate and emission efficiency, the white organic light emitting device may be provided in a tandem structure of two or more stacks where two or more organic light emitting layers are stacked. The tandem structure of two or more stacks needs a charge generating layer disposed between adjacent organic light emitting layers. However, in a structure where the organic light emitting layer and the cathode electrode are connected to each other between adjacent pixels, a current can be leaked from one pixel to an adjacent pixel due to the charge generating layer. That is, the adjacent pixel is affected by the leaked current. In this instance, the adjacent pixel cannot emit desired light due to the leaked current, causing a reduction in a color reproduction rate. Particularly, in high-resolution small display devices applied to virtual reality (VR) devices, smartphones, etc., an interval between pixels is narrow, and for this reason, the adjacent pixel is more affected by the leaked current.

SUMMARY OF THE INVENTION

Accordingly, the present disclosure is directed to provide an organic light emitting display device and a method of manufacturing the same that substantially obviate one or more problems due to limitations and disadvantages of the related art.

An aspect of the present disclosure is directed to provide an organic light emitting display device and a method of manufacturing the same, in which in a white organic light emitting device, an adjacent pixel is prevented from being affected by a leakage current.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including a thin film transistor on a substrate, a planarization layer on the thin film transistor, a contact hole passing through the planarization layer to expose a source or drain electrode of the thin film transistor, a first electrode on the planarization layer, the first electrode being connected to the source or drain electrode of the thin film transistor through the contact hole, a hole between the first electrode and another first electrode adjacent thereto, the hole being a recessed portion of the planarization layer, a pixel defining layer covering the first electrode passing through the contact hole and the planarization layer disposed in the hole, an organic light emitting layer on the first electrode and the pixel defining layer, and a second electrode on the organic light emitting layer.

In another aspect of the present disclosure, there is provided a method of manufacturing an organic light emitting display device including forming a thin film transistor on a substrate, forming a planarization layer on the thin film transistor, forming a contact hole exposing a source or drain electrode of the thin film transistor through the planarization layer, forming a first electrode connected to the source or drain electrode of the thin film transistor through the contact hole, forming a hole, which is a recessed portion of the planarization layer, between the first electrode and another first electrode adjacent thereto, forming a pixel defining layer which covers the first electrode passing through the contact hole and the planarization layer disposed in the hole, and sequentially forming an organic light emitting layer, a second electrode, and an encapsulation layer on the first electrode and the pixel defining layer.

It is to be understood that both the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 9A to 9H are cross-sectional views taken along line I-I' of FIGS. 3 and 4 for describing a method of manufacturing an organic light emitting display device according to an embodiment of the present disclosure.

DETAILED DESCRIPTION OF THE EMBODIMENTS

Figure 1:
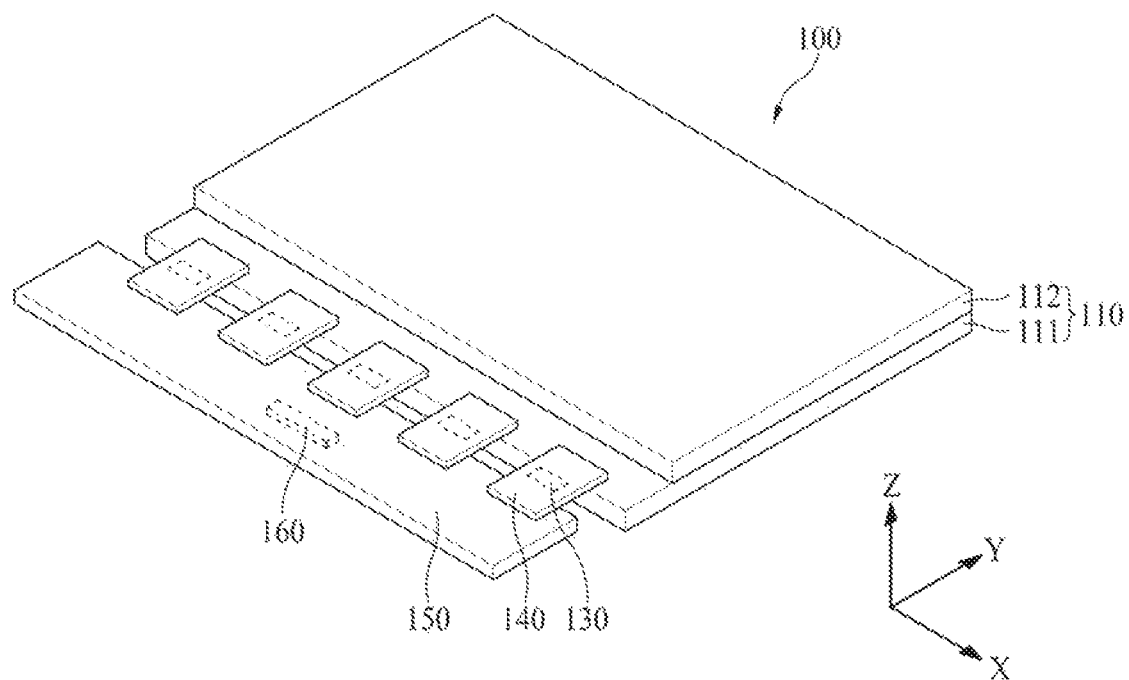
FIG. 1 is a perspective view illustrating an organic light emitting display device according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, example embodiments of the present disclosure will be described in detail with reference to the accompanying drawings.

Figure 2:
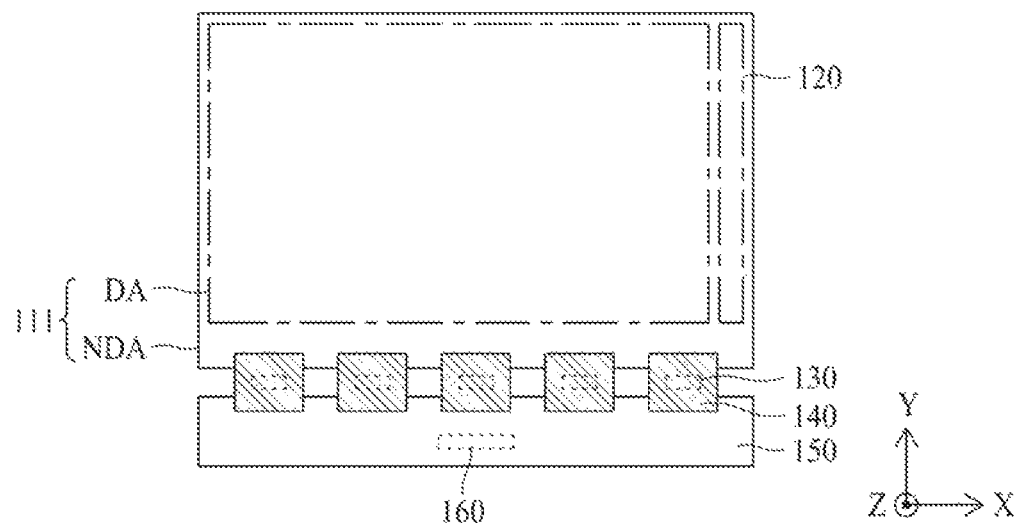
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light emitting display device 100 according to an embodiment of the present disclosure. FIG. 2 is a plan view illustrating a first substrate, a gate driver, a source drive integrated circuit (IC), a flexible film, a circuit board, and a timing controller of FIG. 1.

Referring to FIGS. 1 and 2, the organic light emitting display device 100 according to an embodiment of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 and the second substrate 112 may each be plastic, glass, or the like.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the date lines.

Each of the pixels may include a thin film transistor (TFT) and an organic light emitting device which includes a first electrode, an organic light emitting layer, and a second electrode. When a gate signal is input through a gate line, each of the pixels may supply a certain current to the organic light emitting device by using the TFT according to a data voltage supplied through a data line. Therefore, the organic light emitting device of each of the pixels may emit light having certain brightness according to the certain current. A structure of each of the pixels will be described in detail with reference to FIGS. 3 to 6.

The display panel 110, as illustrated in FIG. 2, may be divided into a display area DA, where the pixels are provided to display an image, and a non-display area NDA which does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads by using an anisotropic conductive film, and thus, the pads may be connected to the lines of the flexible film 140.

The circuit board 150 may be attached on the flexible film 140 which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board through a cable of the circuit board 150. The timing controller 160 may generate a gate control signal for controlling an operation timing of the gate driver 120 and a source control signal for controlling the source drive IC 130 which is provided in plurality, based on the timing signal. The timing controller 160 may supply the gate control signal to the gate driver 120 and may supply the source control signal to the plurality of source drive ICs 130.

Figure 3:
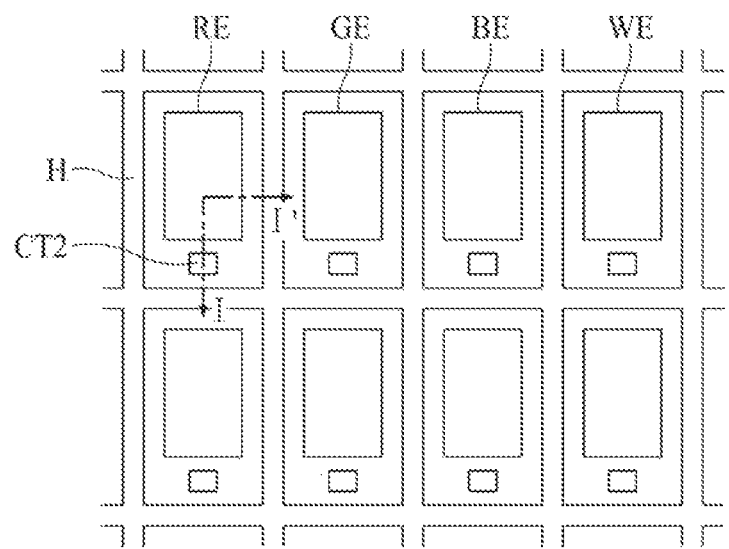
FIG. 3 is a plan view illustrating an example where a hole and emissive areas of pixels are arranged in a display area according to an embodiment of the present disclosure.

FIG. 3 is a plan view illustrating an example where a hole and emissive areas of pixels are arranged in a display area. In FIG. 3, for convenience of description, only a hole H and emissive areas RE, GE, BE, and WE of pixels are illustrated.

Each of the pixels may include one emissive area. The emissive area may denote an area where a first electrode corresponding to an anode electrode, an organic light emitting layer, and a second electrode corresponding to a cathode electrode are sequentially stacked, and a hole from the first electrode and an electron from the second electrode are combined with each other in the organic light emitting layer to emit light. The first electrode is connected to a thin film transistor through a contact hole CHI. The contact hole CHI is between each emissive area and the hole H.

The emissive area may be divided into a red emissive area RE which emits red light by using a red color filter, a green emissive area GE which emits green light by using a green color filter, a blue emissive area BE which emits blue light by using a blue color filter, and a white emissive area WE which emits white light without a color filter. A pixel including the red emissive area RE, a pixel including the green emissive area GE, a pixel including the blue emissive area BE, and a pixel including the white emissive area WE may be defined as one unit pixel.

The hole H may be disposed to surround each of the emissive areas RE, GE, BE, and WE as in FIG. 3. Alternatively, as in FIG. 4, the hole H may be disposed between two adjacent emissive areas of the emissive areas RE, GE, BE, and WE. For this reason, an organic light emitting layer of one pixel may not be connected to an organic light emitting layer of another pixel adjacent to the one pixel. Accordingly, according to an embodiment of the present disclosure, a current is prevented from being leaked from one pixel to another pixel adjacent thereto due to a hole transporting layer and/or a charge generating layer of an organic light emitting layer. That is, according to an embodiment of the present disclosure, the other pixel adjacent to the one pixel is prevented from being affected by the current leaked from the one pixel.

Figure 4:
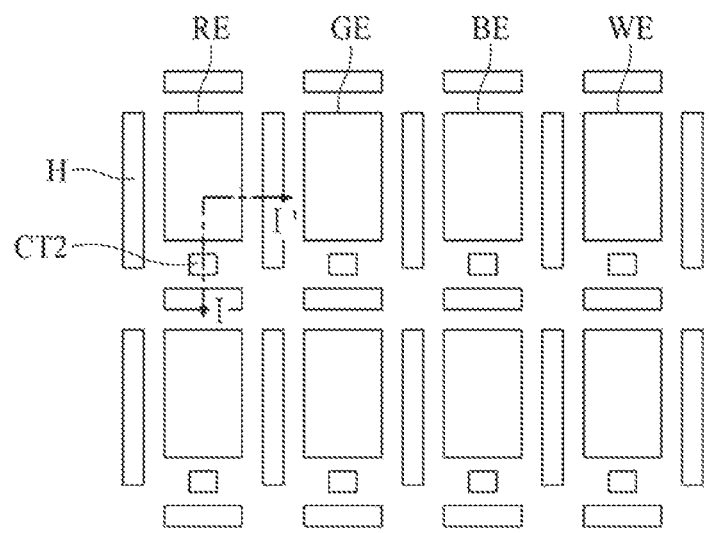
FIG. 4 is a plan view illustrating another example where a hole and emissive areas of pixels are arranged in a display area according to an embodiment of the present disclosure.
Figure 5:
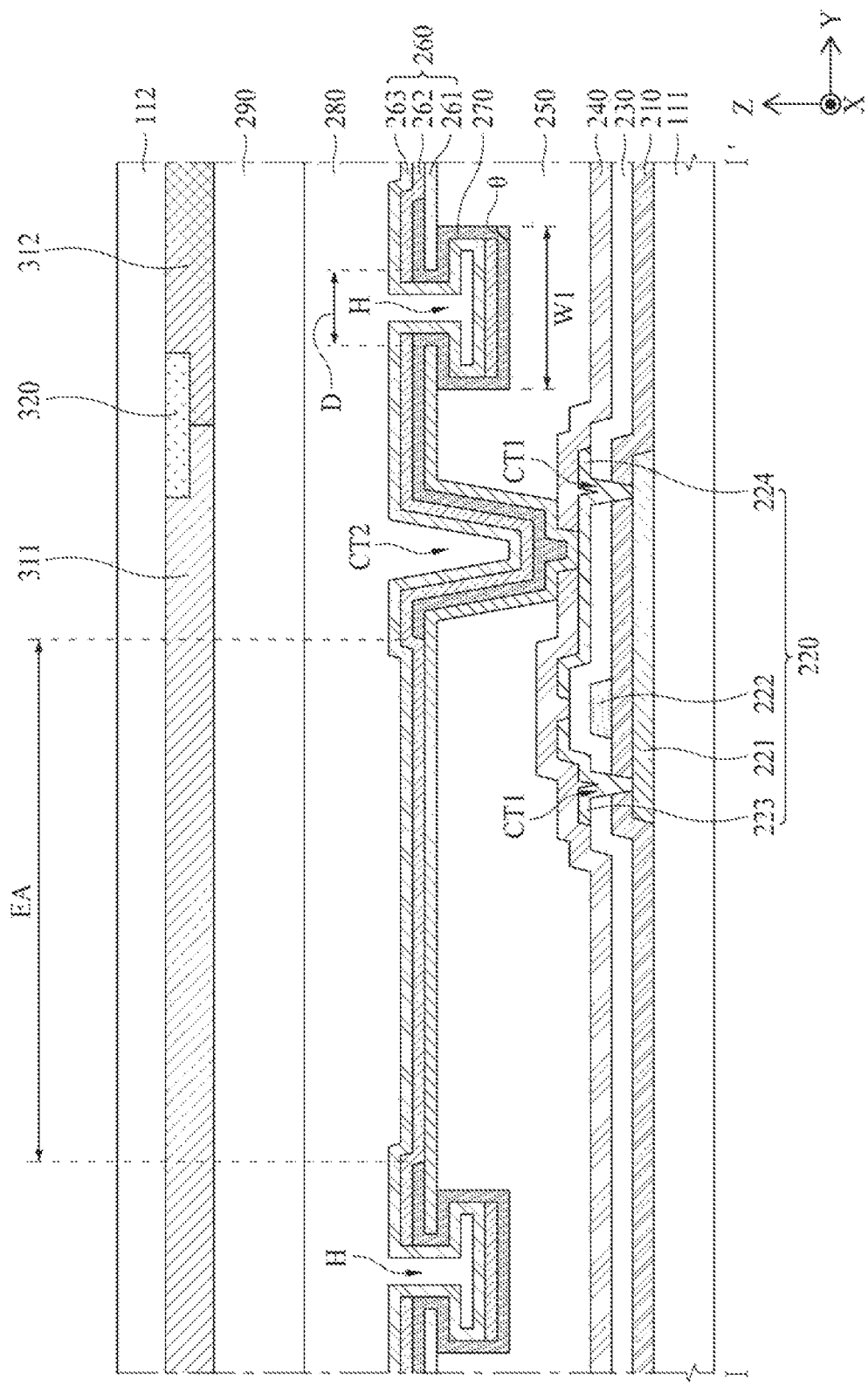
FIG. 5 is a cross-sectional view illustrating an example taken along line I-I' of FIGS. 3 and 4.

FIG. 5 is a cross-sectional view illustrating an example taken along line I-I' of FIGS. 3 and 4.

Referring to FIG. 5, a buffer layer may be formed on one surface of the first substrate 111 facing the second substrate 112. The buffer layer may be formed on the one surface of the first substrate 111, for protecting a plurality of TFTs 220 and a plurality of organic light emitting devices 260 from water which penetrates through the first substrate 111 vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 220 may be formed on the buffer layer. Each of the TFTs 220 may include an active layer 221, a gate electrode 222, a source electrode 223, and a drain electrode 224. In FIG. 5, the TFTs 220 are by example illustrated as being formed in a top gate type where the gate electrode 222 is disposed on the active layer 221, but is not limited thereto. In other embodiments, the TFTs 220 may be formed in a bottom gate type where the gate electrode 222 is disposed under the active layer 221 or a double gate type where the gate electrode 222 is disposed both on and under the active layer 221.

The active layer 221 may be formed on the buffer layer. The active layer 221 may be formed of a silicon-based semiconductor material or an oxide-based semiconductor material. A light blocking layer for blocking external light incident on the active layer 221 may be formed between the buffer layer and the active layer 221.

A gate insulation layer 210 may be formed on the active layer 221. The gate insulation layer 210 may be formed of an inorganic layer, for example, silicon oxide (SiOx), silicon nitride (SiNx), or a multilayer thereof.

The gate electrode 222 and a gate line may be formed on the gate insulation layer 210. The gate electrode 222 and the gate line may each be formed of a single layer or a multilayer which includes one of molybdenum (Mo), chromium (Cr), titanium (Ti), nickel (Ni), neodymium (Nd), and copper (Cu), or an alloy thereof.

An interlayer dielectric 230 may be formed on the gate electrode 222 and the gate line. The interlayer dielectric 230 may be formed of an inorganic layer, for example, SiOx, SiNx, or a multilayer thereof.

The source electrode 223, the drain electrode 224, and a data line may be formed on the interlayer dielectric 230. Each of the source electrode 223 and the drain electrode 224 may contact the active layer 221 through a corresponding contact hole CT1 which passes through the gate insulation layer 210 and the interlayer dielectric 230. The source electrode 223, the drain electrode 224, and the data line may each be formed of a single layer or a multilayer which includes one of Mo, Cr, Ti, Ni, Nd, and Cu, or an alloy thereof.

A passivation layer 240 for insulating the TFTs 220 may be formed on the source electrode 223, the drain electrode 224, and the data line. The passivation layer 240 may be formed of an inorganic layer, for example, SiOx, SiNx, or a multilayer thereof.

A planarization layer 250 for planarizing a step height caused by the TFTs 220 may be formed on the passivation layer 240. The planarization layer 250 may be formed of an organic layer such as acryl resin, epoxy resin, phenolic resin, polyamide resin, polyimide resin, and/or the like.

An organic light emitting device 260 and a pixel defining layer 270 may be formed on the planarization layer 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 223 of the TFT 220 through a contact hole CT2 which passes through the passivation layer 240 and the planarization layer 250. The first electrode 261 may be formed of a metal material, having a high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, and/or the like. The APC alloy may be an alloy of Ag, palladium (Pd), and Cu.

The hole H is provided in the planarization layer. That is, the hole H may be a recessed portion of the planarization layer 250. The hole H may be formed between adjacent first electrodes 261. As in FIG. 5, a width W1 of the hole H may be set wider than a distance D between the adjacent first electrodes 261. That is, the hole H may be formed in a pot shape where a width of a floor is wider than that of an entrance. Alternatively, as in FIG. 6, a width W2 of the hole H may be set equal to or narrower than the distance D between the adjacent first electrodes 261. The hole H may be formed in a form of a trench. The hole H may be generally defined as an interruption, a disconnection, or a cut.

A pixel defining layer 270 may be formed on a portion of the first electrode 261 and in the hole H. For example, the pixel defining layer 270 may be formed on the first electrode 261 in the contact hole CT2, the first electrode 261 between the contact hole CT2 and the hole H. An emissive area EA may be defined as an area where the first electrode 261, the organic light emitting layer 262, and the second electrode 263 are sequentially stacked to emit light. The first electrode 261, the organic light emitting layer 262, and the second electrode 263 may be sequentially stacked in an area where the pixel defining layer 270 is not provided. Accordingly, the pixel defining layer 270 may divide the emissive area EA to define the emissive area EA.

The pixel defining layer 270 may be formed in an atomic layer deposition (ALD) process or an initiated chemical vapor deposition (iCVD) process. If the pixel defining layer 270 is formed in the ALD process, the pixel defining layer 270 may be formed to have a thickness of about 0.01 μm to 0.1 μm, and if the pixel defining layer 270 is formed in the iCVD process, the pixel defining layer 270 may be formed to have a thickness of about 0.1 μm to 1 μm. That is, the pixel defining layer 270 may be formed to fill a portion, instead of a whole portion, of the hole H and may be formed to divide the emissive area EA.

Moreover, a layer formed by the ALD process or the iCVD process is good in step coverage characteristic, and thus, even when the width W1 of the hole H is set wider than the distance D between the adjacent first electrodes 261 as in FIG. 5, the pixel defining layer 270 may be formed on both a sidewall and a floor of the hole H. Particularly, the pixel defining layer 270 may also be formed under the first electrode 261. The step coverage denotes that a layer deposited by a deposition process is continuously connected without being disconnected even in a portion where a step height is formed.

The organic light emitting layer 262 may be formed on the first electrode 261 and the pixel defining layer 270. The organic light emitting layer 262 may be a white light emitting layer emitting white light. In this instance, the organic light emitting layer 262 may be formed in a tandem structure of two or more stacks. The two or more stacks may each include a hole transporting layer, at least one light emitting layer, and an electron transporting layer. That is, the organic light emitting layer 282 may include the hole transporting layer, the at least one light emitting layer, and the electron transporting layer.

Moreover, a charge generating layer may be formed between adjacent stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be an organic layer which is formed by doping a dopant on an organic host material having an ability to transport holes.

The organic light emitting layer 262 may be formed in a deposition process or a solution process, and if the organic light emitting layer 262 is formed in the deposition process, the organic light emitting layer 262 may be formed in an evaporation process. A layer formed in the evaporation process is not good in step coverage characteristic.

Therefore, if the width W1 of the hole H is set wider than the distance D between the adjacent first electrodes 261 as in FIG. 5, the organic light emitting layer 262 may be disconnectedly formed in the hole H. That is, since the organic light emitting layer 262 is formed in the deposition process which is not good in step coverage characteristic, the organic light emitting layer 262 may be formed on only the floor of the hole H without being formed on the sidewall of the hole H.

Figure 6:
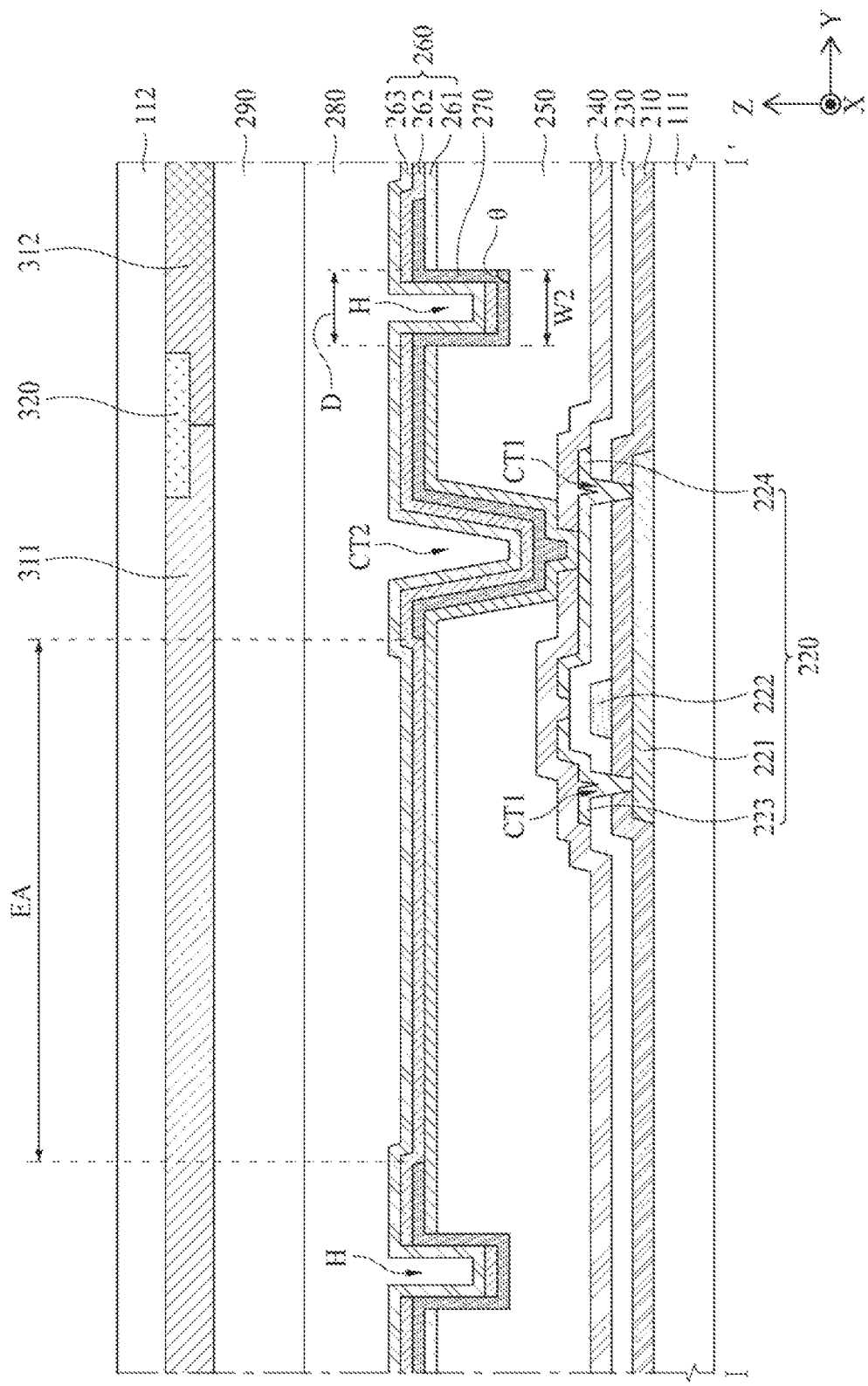
FIG. 6 is a cross-sectional view illustrating another example taken along line I-I' of FIGS. 3 and 4.

Alternatively, if the width W2 of the hole H is set equal to or narrower than the distance D between the adjacent first electrodes 261 as in FIG. 6, a thickness of the organic light emitting layer 262 on the sidewall of the hole H may be set thinner than that of the organic light emitting layer 262 on the floor of the hole H. That is, since an angle "θ" of the sidewall of the hole H is large and the organic light emitting layer 262 is formed in the deposition process which is not good in step coverage characteristic, the organic light emitting layer 262 may be formed thinner on the sidewall of the hole H than the floor of the hole H.

As a result, since the organic light emitting layer 262 is disconnectedly formed in the hole H due to a step height caused by the hole H, an organic light emitting layer of one pixel may not be connected to an organic light emitting layer of another pixel adjacent to the one pixel. Alternatively, since a thickness of the organic light emitting layer 262 on the sidewall of the hole H is set thinner than that of the organic light emitting layer 262 on the floor of the hole H, a resistance of the organic light emitting layer 262 increases between adjacent pixels. Therefore, according to an embodiment of the present disclosure, the amount of current leaked from one pixel to another pixel adjacent thereto due to the hole transporting layer and/or the charge generating layer of the organic light emitting layer 262 is minimized. Accordingly, according to an embodiment of the present disclosure, the other pixel adjacent to the one pixel is prevented from being affected by the current leaked from the one pixel.

The angle "θ" of the sidewall of the hole H may be set to 90 degrees or more, but an embodiment of the present disclosure is not limited thereto. That is, the angle "θ" of the sidewall of the hole H may be set to a degree to which since the organic light emitting layer 262 is formed thinner on the sidewall than the floor of the hole H, the resistance of the organic light emitting layer 262 increases, and thus, another pixel adjacent to one pixel is prevented from being affected by a leakage current leaked from the one pixel. For example, the angle "θ" of the sidewall of the hole H may be set to 70 degrees in an instance where even when the angle "θ" of the sidewall of the hole H is 70 degrees, the resistance of the organic light emitting layer 262 increases, and thus, another pixel adjacent to one pixel is prevented from being affected by a leakage current leaked from the one pixel.

The second electrode 263 may be formed on the organic light emitting layer 262. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 263.

The second electrode 263 may be formed in a physical vapor deposition (PVD) process such as a sputtering process. A layer formed in the PVD process such as the sputtering process is good in step coverage characteristic. Accordingly, the second electrode 263 may be continuously connected without being disconnected despite a step height caused by the hole H.

An encapsulation layer 280 may be formed on the second electrode 263. The encapsulation layer 280 may be formed to fill the contact hole CT2 and the hole H. That is, in order for the organic light emitting layer 262 to be disconnected in the hole H due to the step height caused by the hole H, the pixel defining layer 270 may be thinly formed by the ALD process or the iCVD process. Therefore, the hole H may be filled not by the pixel defining layer 270 but by the encapsulation layer 280.

The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer, an organic layer, and a second inorganic layer. In this instance, the first inorganic layer may be formed on the second electrode 263 to cover the second electrode 263. The organic layer may be formed on the first inorganic layer to cover the first inorganic layer. The organic layer may be formed to have a sufficient thickness for preventing particles from penetrating into the organic light emitting layer 262 and the second electrode 263 via the first inorganic layer. The second inorganic layer may be formed on the organic layer to cover the organic layer.

The first and second inorganic layers may each be formed of silicon nitride, aluminum nitride, zirconium nitride, titanium nitride, hafnium nitride, tantalum nitride, silicon oxide, aluminum oxide, titanium oxide, and/or the like. The organic layer may be formed of acryl resin, epoxy resin, phenolic resin, polyamide resin, polyimide resin, and/or the like.

A plurality of color filters 311 and 312 and a black matrix 320 may be formed on one surface of the second substrate 112 facing the first substrate 111. A red color filter 311 may be formed in a red emissive area RE, a green color filter 312 may be formed in a green emissive area GE, and a blue color filter may be formed in a blue emissive area. The emissive area EA illustrated in FIGS. 5 and 6 may be the red emissive area RE.

The black matrix 320 may be disposed between the color filters 311 and 312. The black matrix 320 may be provided in a non-emissive area instead of the emissive area EA, and thus, may be disposed to overlap the pixel defining layer 270.

The encapsulation layer 280 of the first substrate 111 may be adhered to the color filters 311 and 312 of the second substrate 112 by using an adhesive layer 290, and thus, the first substrate 111 may be bonded to the second substrate 112. The adhesive layer 290 may be a transparent adhesive resin.

As described above, in an embodiment of the present disclosure, the hole H corresponding to the recessed portion of the planarization layer 250 may be formed between adjacent first electrodes 261, and the pixel defining layer 270 may be thinly formed by the ALD process or the iCVD process. As a result, according to an embodiment of the present disclosure, since the hole H is not filled with the pixel defining layer 270, the organic light emitting layer 262 may be disconnected in the hole H due to a step height caused by the hole H, or may be thinly formed on the sidewall of the hole H. Therefore, according to an embodiment of the present disclosure, the amount of current leaked from one pixel to another pixel adjacent thereto due to the hole transporting layer and/or the charge generating layer of the organic light emitting layer is minimized. Accordingly, according to an embodiment of the present disclosure, the other pixel adjacent to the one pixel is prevented from being affected by the current leaked from the one pixel.

Figure 7:
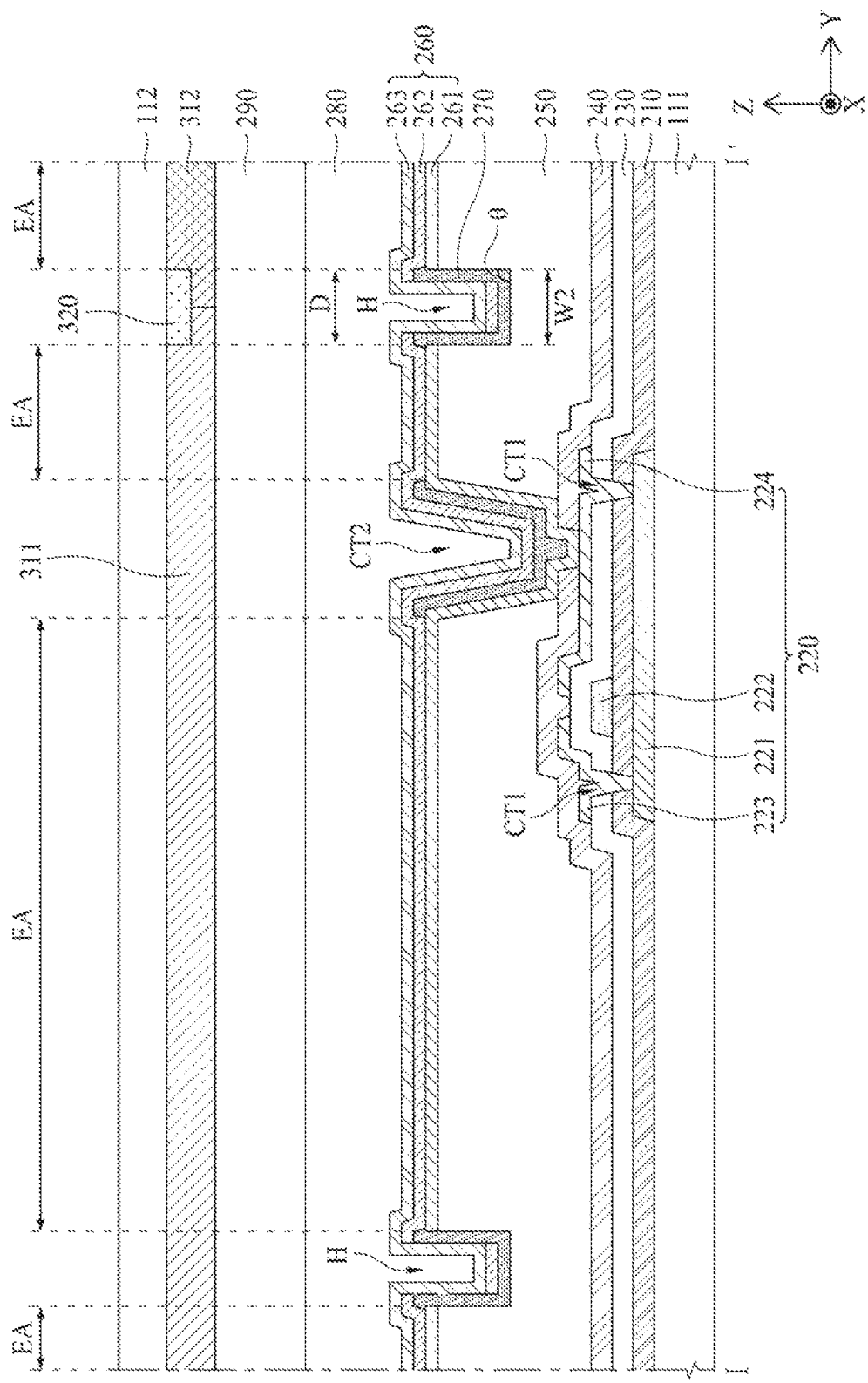
FIG. 7 is a cross-sectional view illustrating another example taken along line I-I' of FIGS. 3 and 4.

FIG. 7 is a cross-sectional view illustrating another example taken along line I-I' of FIGS. 3 and 4.

Except for a pixel defining layer 270, an organic light emitting display device illustrated in FIG. 7 is substantially as described above with reference to FIGS. 5 and 6. In FIG. 7, therefore, detailed descriptions of elements other than the pixel defining layer 270 are omitted.

Referring to FIG. 7, the pixel defining layer 270 may be only formed on the first electrode 261 in the contact hole CT2 and the hole H. Therefore, an emissive area EA where a first electrode 261, an organic light emitting layer 262, and a second electrode 263 are sequentially stacked may be provided outside both sides of the contact hole CT2, and thus, an area of the emissive area EA may increase. Accordingly, the area of the emissive area EA is enlarged in the organic light emitting display device of FIG. 7 than the organic light emitting display device illustrated in FIGS. 5 and 6, and thus, an emission efficiency of an organic light emitting device is enhanced.

Figure 8:
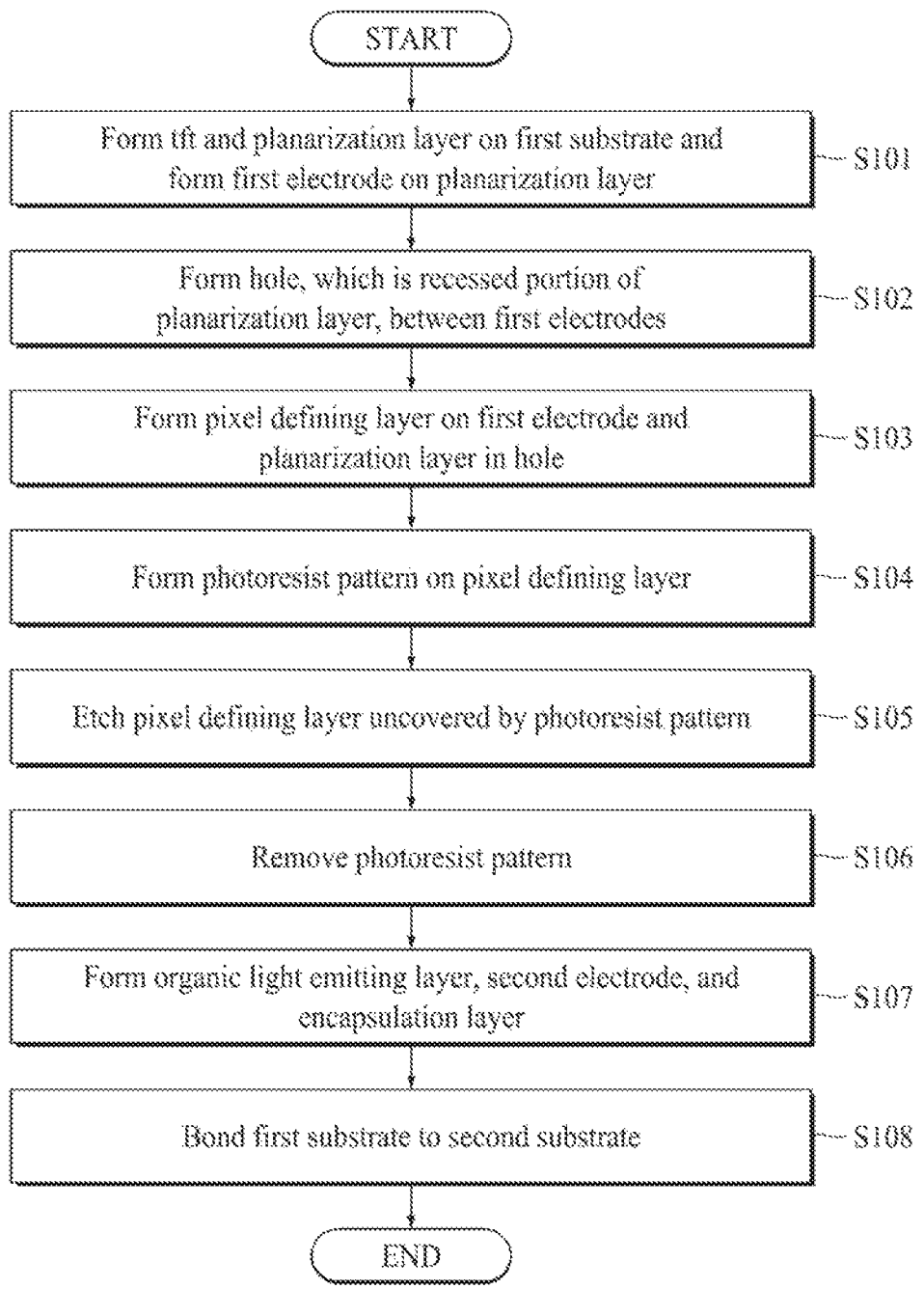
FIG. 8 is a flowchart illustrating a method of manufacturing an organic light emitting display device according to an embodiment of the present disclosure.

FIG. 8 is a flowchart illustrating a method of manufacturing an organic light emitting display device according to an embodiment of the present disclosure. FIGS. 9A to 9H are cross-sectional views taken along line I-I' of FIGS. 3 and 4 for describing a method of manufacturing an organic light emitting display device according to an embodiment of the present disclosure. The cross-sectional views illustrated in FIGS. 9A to 9H relate to the method of manufacturing the organic light emitting display device illustrated in FIG. 5, and thus, like reference numerals refer to like elements. Hereinafter, a method of manufacturing an organic light emitting display device according to an embodiment of the present disclosure will be described in detail with reference to FIGS. 8 and 9A to 9H.

First, as in FIG. 9A, a TFT 220 and a planarization layer 250 may be formed, and a first electrode 261 may be formed on the planarization layer 250.

Before the TFT 220 is formed, a buffer layer may be formed on a first substrate 111, for protecting the TFT 220 from water penetrating through a substrate 100. The buffer layer may include a plurality of inorganic layers which are alternately stacked, for protecting the TFT 220 and an organic light emitting device 260 from water which penetrates through the first substrate 111 vulnerable to penetration of water. For example, the buffer layer may be formed of a multilayer where one or more inorganic layers of silicon oxide (SiOx), silicon nitride (SiNx), and SiON are alternately stacked. The buffer layer may be formed by using a chemical vapor deposition (CVD) process.

Subsequently, an active layer 221 of the TFT 220 may be formed on the buffer layer. In detail, an active metal layer may be formed all over the buffer layer by using a sputtering process, a metal organic chemical vapor (MOCVD) process, and/or the like. Subsequently, the active layer 221 may be formed by patterning the active metal layer through a mask process using a photoresist pattern. The active layer 211 may be formed of a silicon-based semiconductor material, an oxide-based semiconductor material, and/or the like.

Subsequently, a gate insulation layer 210 may be formed on the active layer 221. The gate insulation layer 210 may be formed of an inorganic layer, for example, silicon oxide (SiOx), silicon nitride (SiNx), or a multilayer thereof.

Subsequently, a gate electrode 222 of the TFT 220 may be formed on the gate insulation layer 210. In detail, a first metal layer may be formed all over the gate insulation layer 210 by using a sputtering process, an MOCVD process, and/or the like. Subsequently, the gate electrode 222 may be formed by patterning the first metal layer through a mask process using a photoresist pattern. The gate electrode 222 may be formed of a single layer or a multilayer which includes one of molybdenum (Mo), chromium (Cr), titanium (Ti), nickel (Ni), neodymium (Nd), and copper (Cu), or an alloy thereof.

Subsequently, an interlayer dielectric 230 may be formed on the gate electrode 222. The interlayer dielectric 230 may be formed of an inorganic layer, for example, SiOx, SiNx, or a multilayer thereof.

Subsequently, a plurality of contact holes CT1 which pass through the gate insulation layer 210 and the interlayer dielectric 230 to expose the active layer 211 may be formed.

Subsequently, a source electrode 223 and a drain electrode 224 of the TFT 220 may be formed on the interlayer dielectric 230. In detail, a second metal layer may be formed all over the interlayer dielectric 230 by using a sputtering process, an MOCVD process, and/or the like. Subsequently, the source electrode 223 and the drain electrode 224 may be formed by patterning the second metal layer through a mask process using a photoresist pattern. Each of the source electrode 223 and the drain electrode 224 may contact the active layer 221 through a corresponding contact hole CT1 which passes through the gate insulation layer 210 and the interlayer dielectric 230. The source electrode 223 and the drain electrode 224 may each be formed of a single layer or a multilayer which includes one of Mo. Cr, Ti. Ni, Nd. and Cu, or an alloy thereof.

Subsequently, a passivation layer 240 may be formed on the source electrode 223 and the drain electrode 224 of the TFT 220. The passivation layer 240 may be formed of an inorganic layer, for example, SiOx. SiNx, or a multilayer thereof. The passivation layer 240 may) be formed by using a CVD process.

Subsequently, a planarization layer 250 for planarizing a step height caused by the TFT 220 may be formed on the passivation layer 240. The passivation layer 250 may be formed of an organic layer such as acryl resin, epoxy resin, phenolic resin, polyamide resin, polyimide resin, and/or the like.

Subsequently, a first electrode 261 of the organic light emitting device 260 may be formed on the planarization layer 250. In detail, a third metal layer may be formed all over the planarization layer 250 by using a sputtering process, an MOCVD process, and/or the like. Subsequently, the first electrode 261 may be formed by patterning the third metal layer through a mask process using a photoresist pattern. The first electrode 261 may be connected to the source electrode 223 of the TFT 220 through a contact hole CT2 which passes through the passivation layer 240 and the planarization layer 250. The first electrode 261 may be formed of a metal material, having a high reflectivity, such as a stacked structure (Ti/Al/Ti) of aluminum (Al) and titanium (Ti), a stacked structure (ITO/Al/TO) of Al and ITO, an APC alloy, a stacked structure (ITO/APC/ITO) of an APC alloy and ITO, and/or the like (S101 of FIG. 8).

Figure 9B:
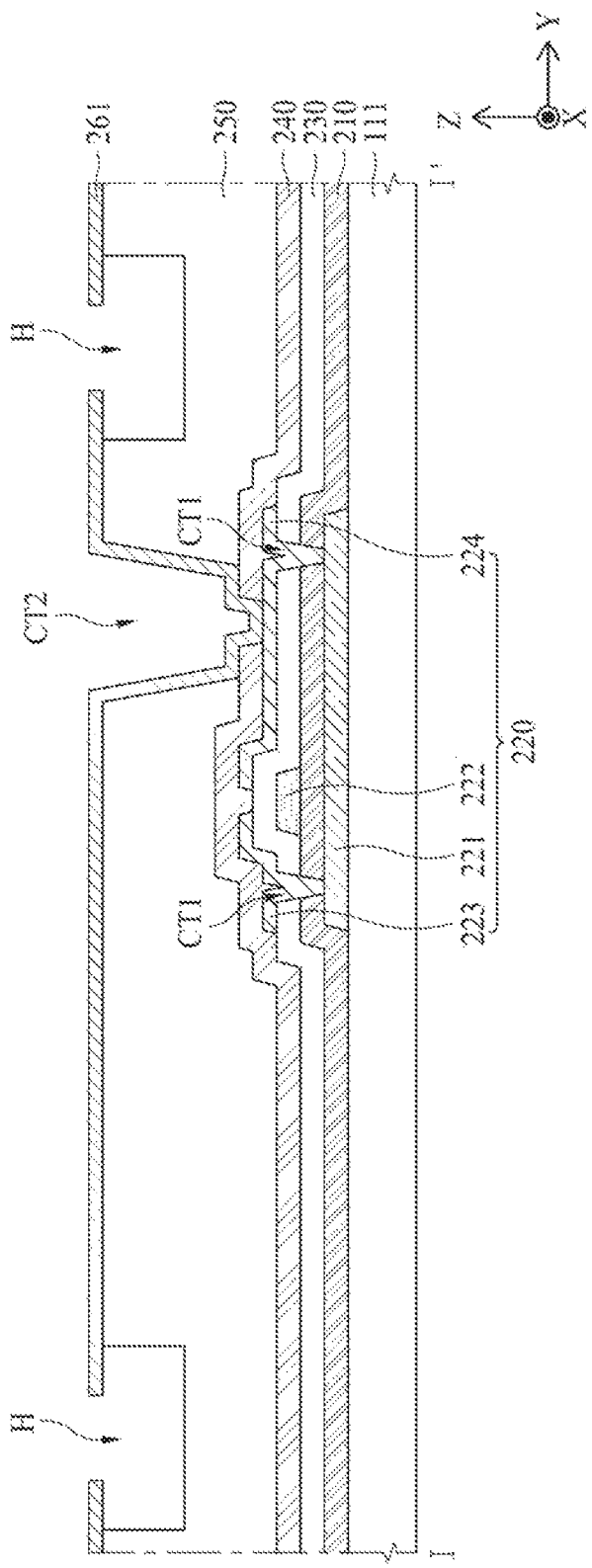

Second, as in FIG. 9B, a hole H corresponding to a recessed portion of the planarization layer 250 may be formed between adjacent first electrodes 261. In detail, by dry-etching the planarization layer 250 with the first electrodes 261 as a mask, the hole H corresponding to the recessed portion of the planarization layer 250 may be formed between the adjacent first electrodes 261. A material applied to the dry-etching may be $O_2$ or a mixed gas of $O_2$ and $CF_4$.

As in FIG. 5, a width W1 of the hole H may be set wider than a distance D between the adjacent first electrodes 261. Alternatively, as in FIG. 6, a width W2 of the hole H may be set equal to or narrower than the distance D between the adjacent first electrodes 261 (S102 of FIG. 8).

Figure 9C:
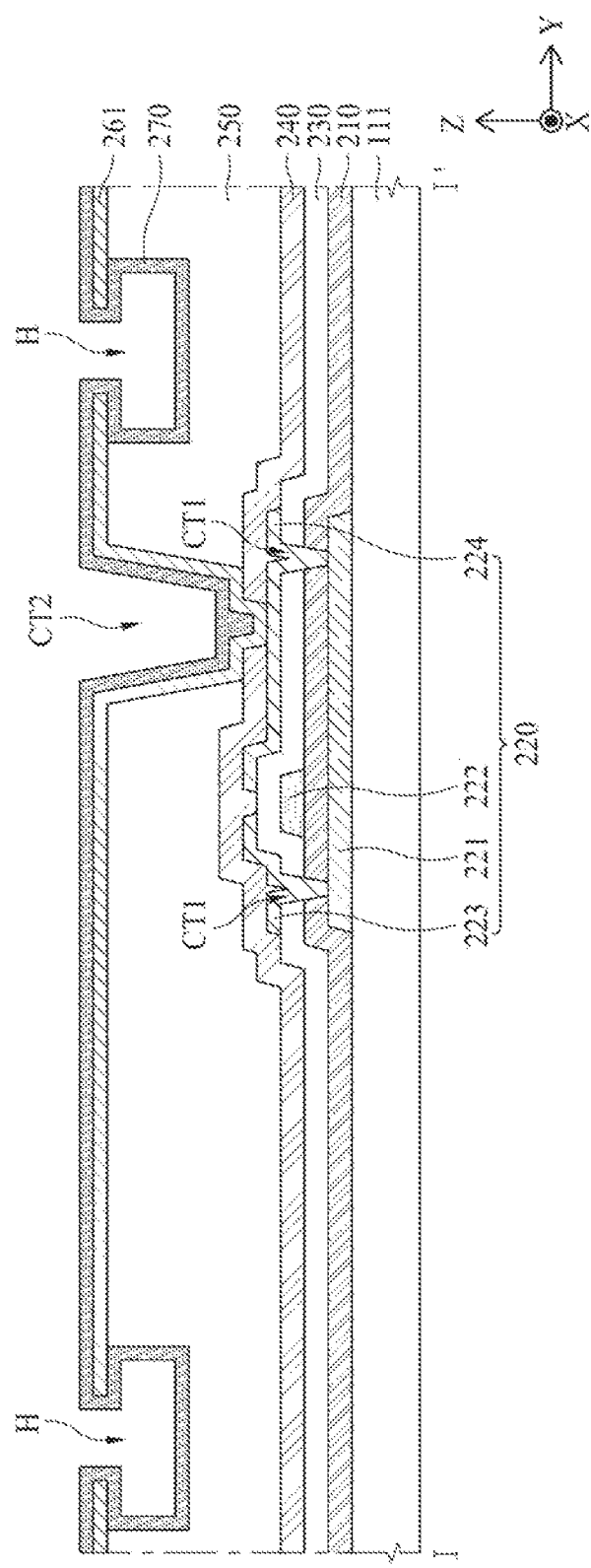

Third, as in FIG. 9C, a pixel defining layer 270 may be formed on the planarization layer 250 disposed in the hole H and the first electrode 261. That is, the pixel defining layer 270 may be formed all over the first substrate 111. The pixel defining layer 270 may be an insulation layer.

The pixel defining layer 270 may be formed in an atomic layer deposition (ALD) process or an initiated chemical vapor deposition (iCVD) process. If the pixel defining layer 270 is formed in the ALD process, the pixel defining layer 270 may be formed to have a thickness of about 0.01 μm to 0.1 μm, and if the pixel defining layer 270 is formed in the iCVD process, the pixel defining layer 270 may be formed to have a thickness of about 0.1 μm to 1 μm.

A layer formed in the ALD process or the iCVD process is good in step coverage characteristic. Therefore, a layer formed by the ALD process or the iCVD process is good in step coverage characteristic, and thus, even when the width W1 of the hole H is set wider than the distance D between the adjacent first electrodes 261 as in FIG. 5, the pixel defining layer 270 may be formed on both a sidewall and a floor of the hole H. Particularly, the pixel defining layer 270 may also be formed under the first electrode 261. That is, the pixel defining layer 270 may be continuously connected without being disconnected despite a step height caused by the hole H (S103 of FIG. 8).

Figure 9D:
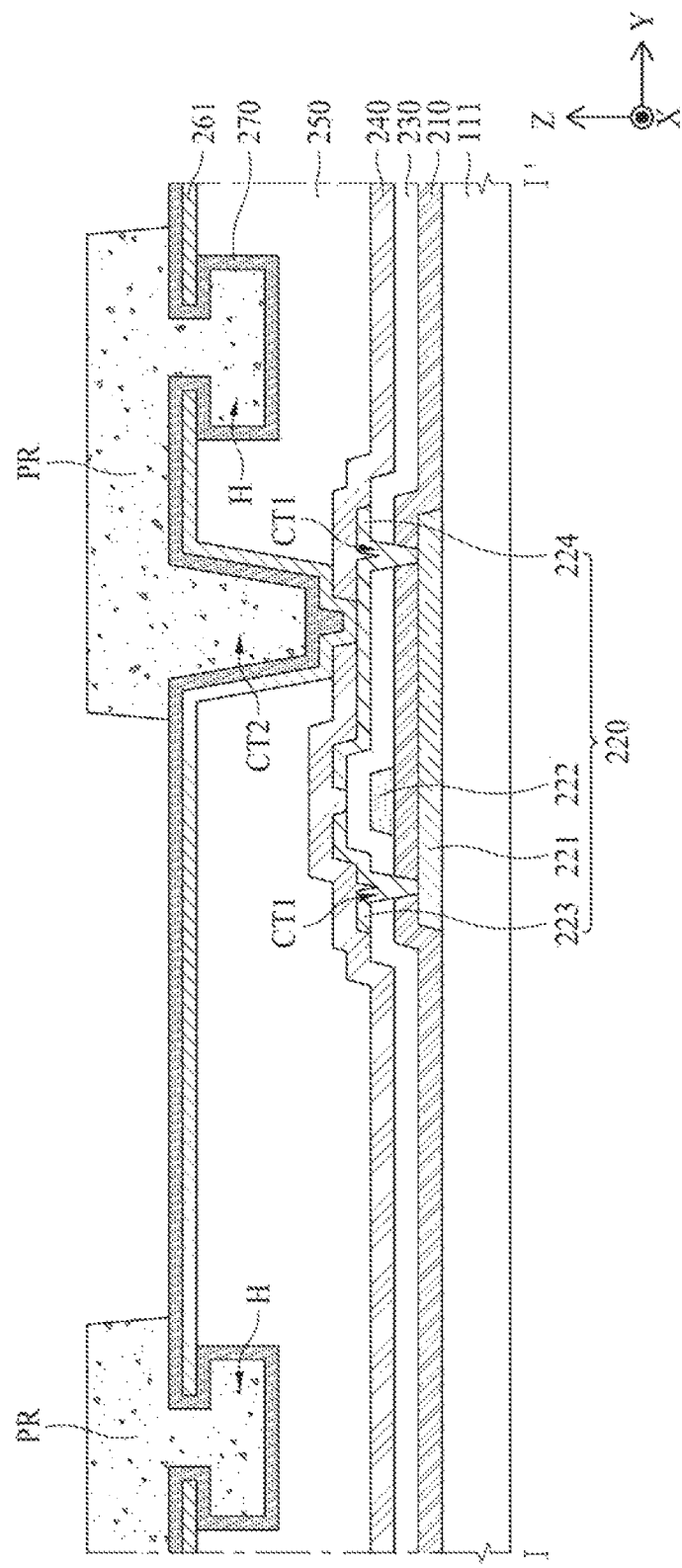

Fourth, as in FIG. 9D, a photoresist pattern PR may be formed on the pixel defining layer 270. The photoresist pattern PR may be formed in an area other than an emissive area EA (S104 of FIG. 8).

Figure 9E:
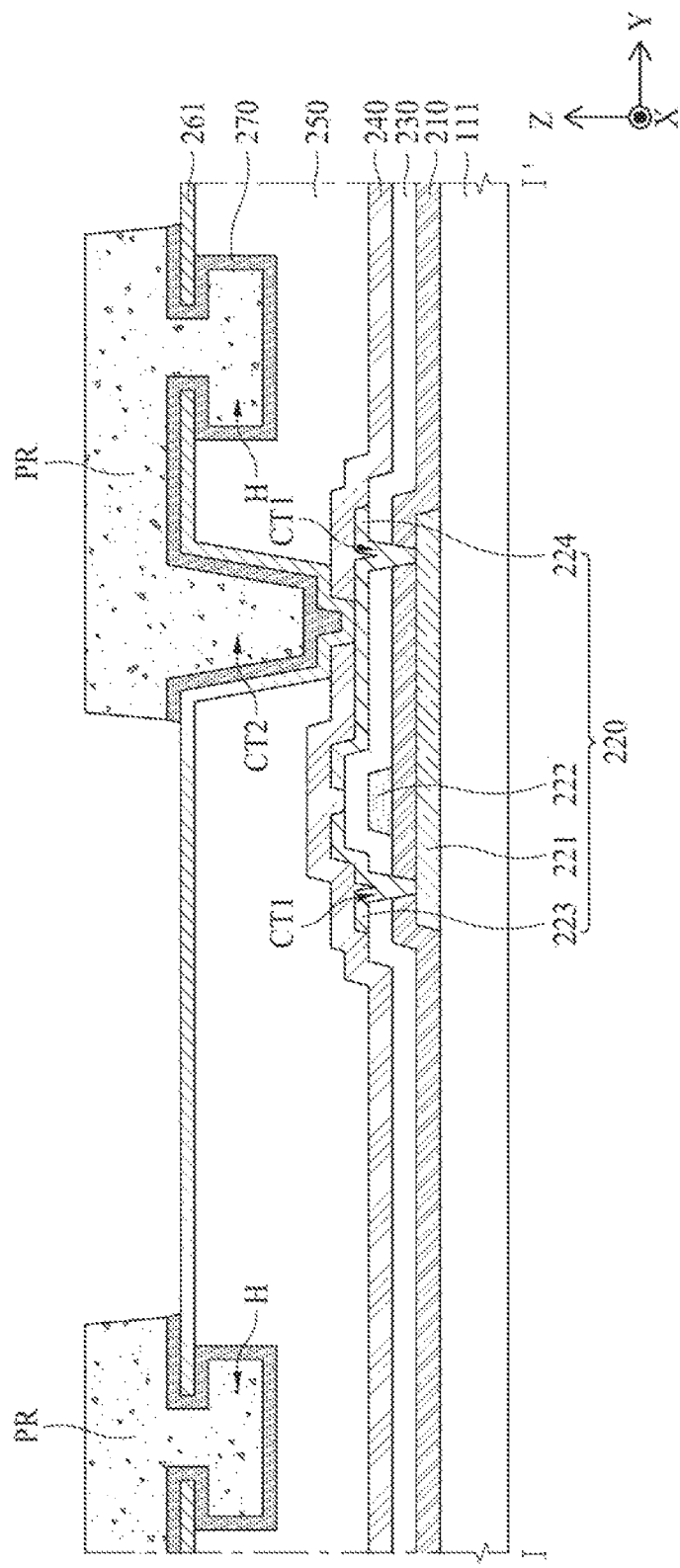

Fifth, as in FIG. 9E, the pixel defining layer 270 uncovered by the photoresist pattern PR may be dry-etched. Therefore, a portion of the first electrode 261 corresponding to the emissive area EA may be exposed (S105 of FIG. 8).

Sixth, as in FIG. 9F, the photoresist pattern PR may be removed (S106 of FIG. 8).

Figure 9G:
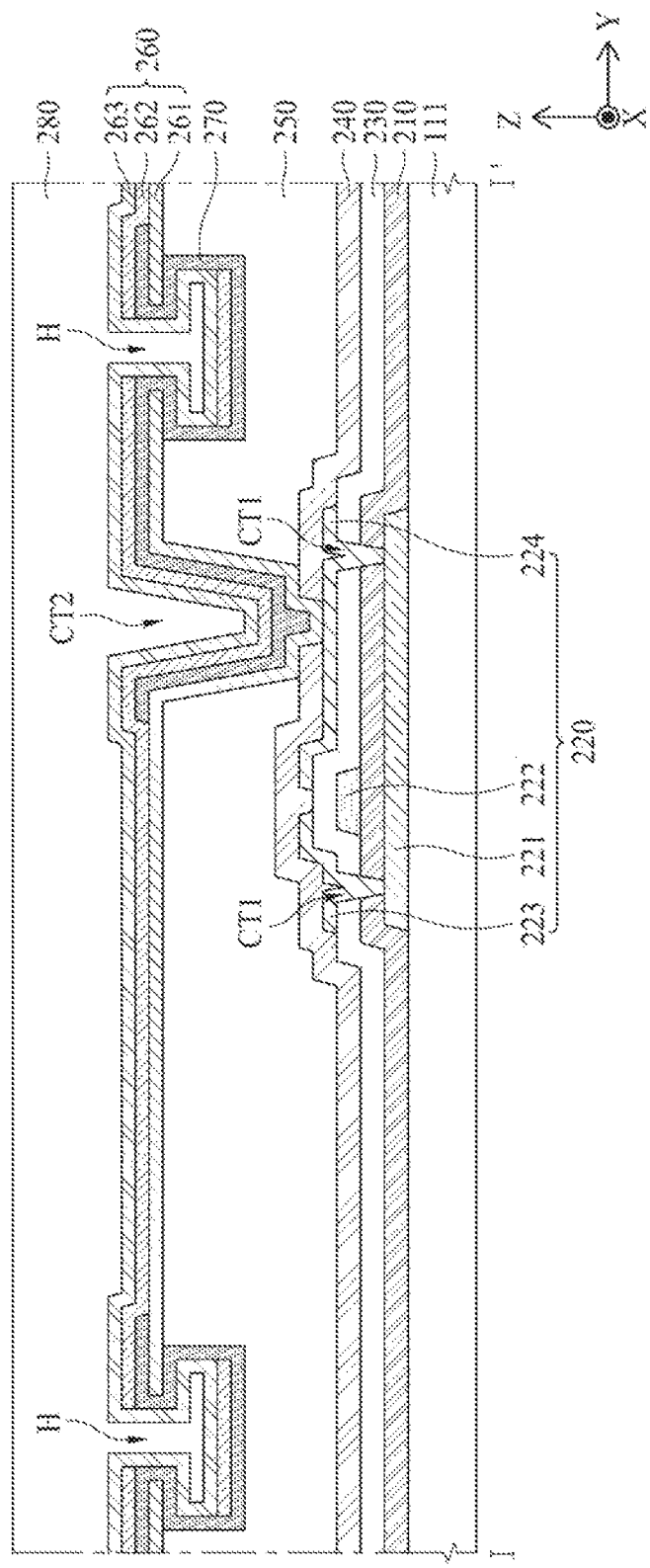

Seventh, as in FIG. 9G, an organic light emitting layer 262, a second electrode 263, and an encapsulation layer 280 may be sequentially formed on the first electrode 261 and the pixel defining layer 270.

In detail, the organic light emitting layer 262 may be formed on the first electrode 261 and the pixel defining layer 270 in a deposition process or a solution process. If the organic light emitting layer 262 is formed in the deposition process, the organic light emitting layer 262 may be formed in an evaporation process. A layer formed in the evaporation process is not good in step coverage characteristic.

Therefore, if the width W1 of the hole H is set wider than the distance D between the adjacent first electrodes 261 as in FIG. 5, the organic light emitting layer 262 may be disconnectedly formed in the hole H. That is, since the organic light emitting layer 262 is formed in the deposition process which is not good in step coverage characteristic, the organic light emitting layer 262 may be formed on only the floor of the hole H without being formed on the sidewall of the hole H.

Alternatively, if the width W2 of the hole H is set equal to or narrower than the distance D between the adjacent first electrodes 261 as in FIG. 6, a thickness of the organic light emitting layer 262 on the sidewall of the hole H may be set thinner than that of the organic light emitting layer 262 on the floor of the hole H. That is, since an angle "θ" of the sidewall of the hole H is large and the organic light emitting layer 262 is formed in the deposition process which is not good in step coverage characteristic, the organic light emitting layer 262 may be formed thinner on the sidewall of the hole H than the floor of the hole H.

As a result, since the organic light emitting layer 262 is disconnectedly formed in the hole H due to a step height caused by the hole H, an organic light emitting layer of one pixel may not be connected to an organic light emitting layer of another pixel adjacent to the one pixel. Alternatively, since a thickness of the organic light emitting layer 262 on the sidewall of the hole H is set thinner than that of the organic light emitting layer 262 on the floor of the hole H, a resistance of the organic light emitting layer 262 increases between adjacent pixels. Therefore, according to an embodiment of the present disclosure, the amount of current leaked from one pixel to another pixel adjacent thereto due to the hole transporting layer and/or the charge generating layer of the organic light emitting layer 262 is minimized. Accordingly, according to an embodiment of the present disclosure, the other pixel adjacent to the one pixel is prevented from being affected by the current leaked from the one pixel.

Subsequently, the second electrode 263 may be formed on the organic light emitting layer 262. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. The second electrode 263 may be formed in a physical vapor deposition (PVD) process such as a sputtering process. A layer formed in the PVD process such as the sputtering process is good in step coverage characteristic. Accordingly, the second electrode 263 may be continuously connected without being disconnected despite a step height caused by the hole H.

Subsequently, a capping layer may be formed on the second electrode 263.

Subsequently, an encapsulation layer 280 may be formed on the second electrode 263. The encapsulation layer 280 may be formed to fill the contact hole CT2 and the hole H.

The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer, an organic layer, and a second inorganic layer. In this instance, the first inorganic layer may be formed on the second electrode 263 to cover the second electrode 263. The organic layer may be formed on the first inorganic layer to cover the first inorganic layer. The organic layer may be formed to have a sufficient thickness for preventing particles from penetrating into the organic light emitting layer 262 and the second electrode 263 via the first inorganic layer. The second inorganic layer may be formed on the organic layer to cover the organic layer.

The first and second inorganic layers may each be formed of silicon nitride, aluminum nitride, zirconium nitride, titanium nitride, hafnium nitride, tantalum nitride, silicon oxide, aluminum oxide, titanium oxide, and/or the like. The organic layer may be formed of acryl resin, epoxy resin, phenolic resin, polyamide resin, polyimide resin, and/or the like (S107 of FIG. 8).

Figure 9H:
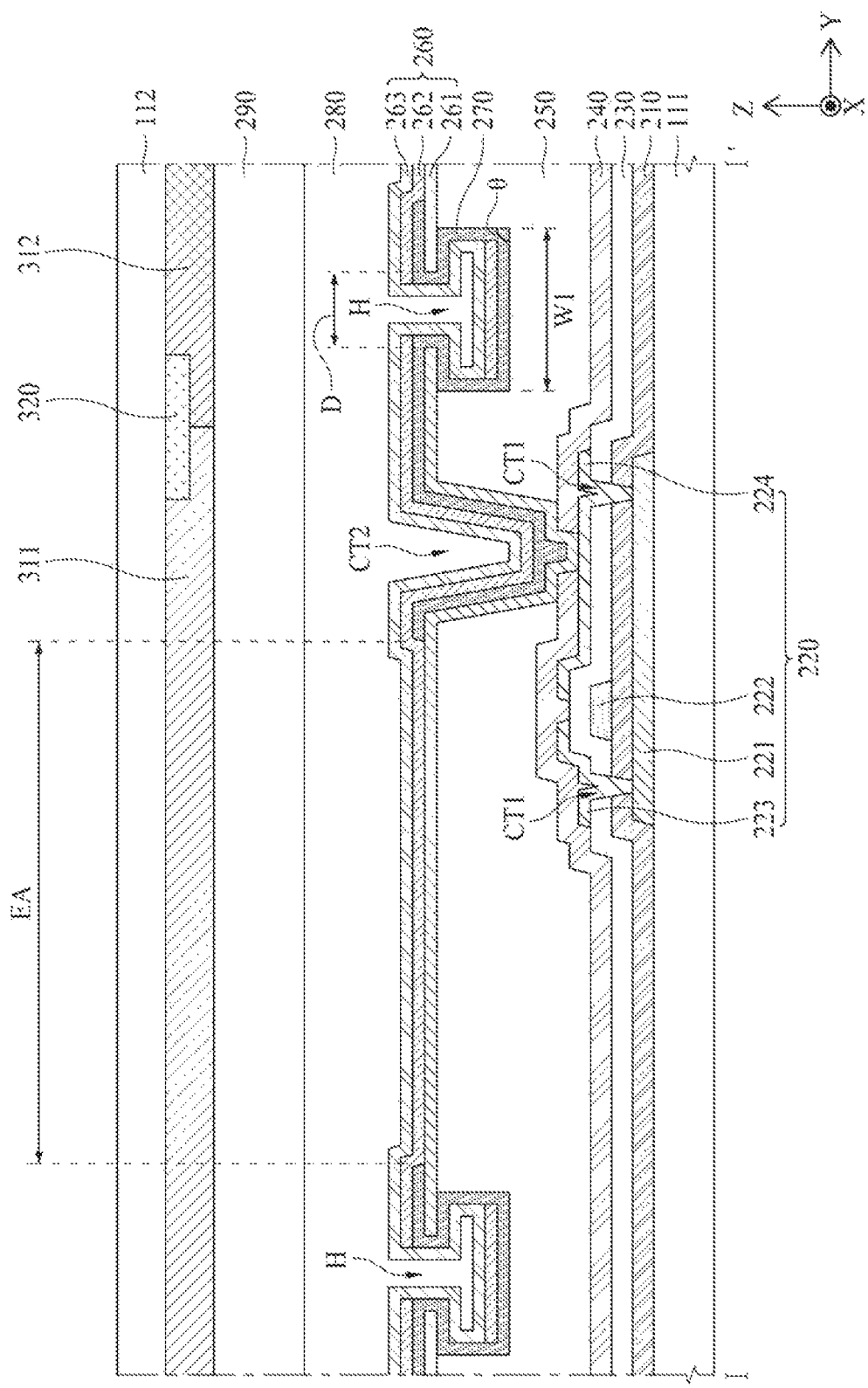

Eighth, as in FIG. 9H, the encapsulation layer 280 of the first substrate 111 may be adhered to the color filters 311 and 312 of the second substrate 112 by using an adhesive layer 290. Therefore, the first substrate 111 may be bonded to the second substrate 112. The adhesive layer 290 may be a transparent adhesive resin (S108 of FIG. 8).

As described above, in an embodiment of the present disclosure, the hole H corresponding to the recessed portion of the planarization layer 250 may be formed between adjacent first electrodes 261, and the pixel defining layer 270 may be thinly formed by the ALD process or the iCVD process. As a result, according to an embodiment of the present disclosure, since the hole H is not filled with the pixel defining layer 270, the organic light emitting layer 262 may be disconnected in the hole H due to a step height caused by the hole H. or may be thinly formed on the sidewall of the hole H. Therefore, according to an embodiment of the present disclosure, the amount of current leaked from one pixel to another pixel adjacent thereto due to the hole transporting layer and/or the charge generating layer of the organic light emitting layer is minimized. Accordingly, according to an embodiment of the present disclosure, the other pixel adjacent to the one pixel is prevented from being affected by the current leaked from the one pixel.

Moreover, according to the embodiments of the present disclosure, the hole may be formed in order for the planarization layer to be recessed between the first electrodes, and the pixel defining layer may be thinly formed by the ALD process or the iCVD process. As a result, according to the embodiments of the present disclosure, since the hole is not filled with the pixel defining layer, the organic light emitting layer may be disconnected in the hole due to a step height caused by the hole, or may be thinly formed on a sidewall of the hole. Therefore, according to the embodiments of the present disclosure, the amount of current leaked from one pixel to another pixel adjacent thereto due to the hole transporting layer and/or the charge generating layer of the organic light emitting layer is minimized. Accordingly, according to the embodiments of the present disclosure, the other pixel adjacent to the one pixel is prevented from being affected by the current leaked from the one pixel.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A method of manufacturing an organic light emitting display device, the method comprising:
   forming a thin film transistor on a substrate, the substrate having a plurality of emissive areas;
   forming a planarization layer on the thin film transistor;
   forming a contact hole exposing a source or drain electrode of the thin film transistor through the planarization layer;
   forming a first electrode connected to the source or drain electrode of the thin film transistor through the contact hole;
   forming a hole between adjacent emissive areas, the hole being provided in the planarization layer;
   forming a pixel defining layer on a portion of the first electrode and in the hole,
   wherein the pixel defining layer fills a portion of the hole and is provided on both side wall and floor of the hole; and
   forming a light emitting layer, a second electrode and an encapsulation layer sequentially on the substrate having the first electrode and the pixel defining layer,
   wherein a portion of the light emitting layer is provide both on the floor of the hole and on the contact hole, and
   wherein a thickness of the portion of the light emitting layer on a sidewall of the hole is thinner than a thickness of the portion of the light emitting layer on the floor of the hole, or the portion of the light emitting layer on the first electrode and the contact hole disconnect the portion of the light emitting layer on the floor of the hole.

2. The method of claim 1, wherein the forming of the pixel defining layer comprises:
   depositing the pixel defining layer on the portion of the first electrode and in the hole by using an atomic layer deposition (ALD) process or an initiated chemical vapor deposition (iCVD) process.

3. The method of claim 2, wherein the forming of the pixel defining layer further comprises:
   forming a photoresist pattern on the pixel defining layer;
   etching the pixel defining layer uncovered by the photoresist pattern to expose the portion of the first electrode; and
   removing the photoresist pattern.

4. The method of claim 1, wherein the hole is between the first electrode of the first emissive area and the first electrode of the second emissive area.

5. The method of claim 1, wherein a width of the hole is wider than a distance between one first electrode of the first emissive area and one first electrode of the second emissive area.

6. The method of claim 1, wherein one second electrode is provided on the pixel defining layer in the hole.

7. The method of claim 1, wherein a width of the hole is equal to or narrower than a distance between one first electrode of the first emissive area and one first electrode of the second emissive area.

8. The method of claim 1, wherein the pixel defining layer fills a portion of the contact hole.

9. The method of claim 1, wherein the encapsulation layer fills the contact hole and the hole.

10. The method of claim 9, further comprising:
    forming a plurality of color filters on the encapsulation layer; and
    forming a black matrix between adjacent color filters, the black matrix overlapping the pixel defining layer.

11. The method of claim 10, wherein the hole is aligned with the black matrix.

12. The method of claim 1, wherein the plurality of emissive areas are divided by the pixel defining layer.

13. The method of claim 1, wherein the hole is disposed to surround an emissive area of the plurality of emissive areas.

14. The method of claim 1, wherein the contact hole is between an emissive area of the plurality of emissive areas and the hole.

15. The method of claim 1, wherein the light emitting layer include a white organic light emitting layer.

* * * * *